United States Patent [19]

Gleim

[11] 4,341,924
[45] Jul. 27, 1982

[54] SUPERCONDUCTOR

[76] Inventor: William K. T. Gleim, 1250 NW. 120th St., Seattle, Wash. 98177

[21] Appl. No.: 118,234

[22] Filed: Feb. 4, 1980

[51] Int. Cl.³ .............................................. H01B 7/34
[52] U.S. Cl. .................... 174/15 S; 29/599; 174/126 S; 174/126 CP; 427/62
[58] Field of Search ............. 174/15 CA, 15 S, 126 S, 174/126 CP, 128 S, DIG. 7; 29/502, 599; 427/62; 428/375; 336/DIG. 1

[56] References Cited

U.S. PATENT DOCUMENTS

| | | | |
|---|---|---|---|
| 3,370,344 | 2/1968 | Feick, III et al. | 29/50 Z |
| 3,612,742 | 10/1971 | Snowden | 174/15 S |
| 3,615,881 | 10/1971 | Greene | 174/126 S |
| 3,657,467 | 4/1972 | Matthaws et al. | 174/126 S |
| 3,675,042 | 7/1972 | Merriam | 174/126 S X |
| 3,781,982 | 1/1974 | Ziemiak et al. | 29/599 |
| 3,890,700 | 6/1975 | Diepers et al. | 29/599 |
| 4,060,693 | 11/1977 | Meyerhoff | 174/126 S |

FOREIGN PATENT DOCUMENTS 1814036 9/1969 Fed. Rep. of Germany .
2005511 12/1969 France .................... 174/15 S Primary Examiner—Volodymyr Y. Mayewsky

[57] ABSTRACT

A superconductive article is described which comprises an electrically normal conductive metal cable having on the outer surface thereof a layer containing cobalt phthalocyanine and an alkali metal. The ratio of alkali metal atoms to cobalt phthalocyanine molecules in said layer is suitably about 8:1. The electrically normal conductive metal is preferably aluminum and the cable is preferably hollow.

9 Claims, 3 Drawing Figures

SUPERCONDUCTOR

BACKGROUND OF THE INVENTION

1. Field of the Invention

This invention relates to superconductive articles. Specifically, the invention relates to superconductive cables having an alkali metal activated cobalt phthalocyanine material coated on the outer surface therof to impart the superconductive characteristics thereto.

2. Description of the Prior Art

Superconductive articles such as cables for the transmission of electricity are well known. In the fabrication of such articles certain material such as nobium can advantageously be used in the form of a thin layer which is deposited on a tubular shaped metal of high normal electric conductivity (see U.S. Pat. No. 4,060,693). Aluminum in very pure form is particularly well suited as the tubular shaped metal. The use of such composite superconducting cables has been recognized, see for example, German Offenlengungschrift No. 1,814,036, and Bulletin of the Schweizerischer Elektrotechnischer Verein (Swiss Society of Electrical Engineers) Vo. 61 (1970), pp. 1179 to 1190. As shown in U.S. Pat. No. 3,657,467 electrical cables have also heretofore been fabricated utilizing electrically normal conducting metals joined in good electrically conductive and heat conductive relation to superconductors. To this end superconductors have been embedded in the electrically normal conductive metals or in other fashions connected electrically in parallel with electrically normal conductive metals.

In accordance with the present invention, I have discovered that a superconductive article suitable for transmission of electric current can be obtained by coating an electrically normal conductive cable with a layer comprising cobalt phthalocyanine and an alkali metal. The ratio of alkali metal atoms to cobalt phthalocyanine molecules in the layer is suitably about 8:1, the electrically normal conductive metal cable preferably comprises aluminum; and, the cable is suitably of hollow configuration.

Utilizing the alkali metal-activated cobalt phthalocyanine coated cable of the present invention allows for attainment of superconductivity at temperatures above those provided by liquid or cold helium in the gaseous state. In accordance with applicant's invention superconductivity can be obtained at the boiling point of liquid nitrogen. Suitably, superconductivity can be obtained utilizing fluids having a boiling temperature of under about 150° K., such as liquid hydrogen, liquid nitrogen or other cooling mediums providing corresponding temperatures.

It is, therefore, a principal object of this invention to provide a superconductive cable of current-carrying ability, which cable operates as a superconductor at temperatures above the boiling point of liquid helium.

SUMMARY OF THE INVENTION

The present invention in its broadest aspect relates to a superconductive article. The article comprises an electrically normal conductive metal cable which has a layer containing cobalt phthalocyanine and an alkali metal thereupon. The ratio of the alkali metal atoms to cobalt phthalocyanine molecules in the layer coating the metal cable layer, is about 8:1. The electrically normal conductive metal is preferably aluminum.

In one embodiment of the invention, the cable is hollow and the layer is located on the outer surface of the hollow cable. The hollow cable preferably is comprised of aluminum and in the layer coating the outer surface of the hollow cable the ratio of alkali metal atoms to cobalt phthalo cyanine molecules is about 8:1.

Generally, the layer should be at least 1 mil thick, and preferably the layer should be from about 10 mils to about 100 mils in thickness.

DETAILED DESCRIPTION OF THE INVENTION

Figure 1:
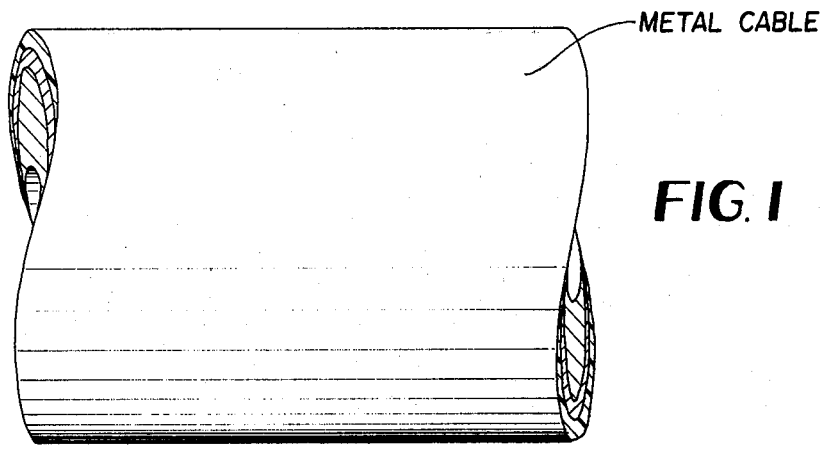
FIG. 1 is a side plan view of the metal cable.
Figure 2:
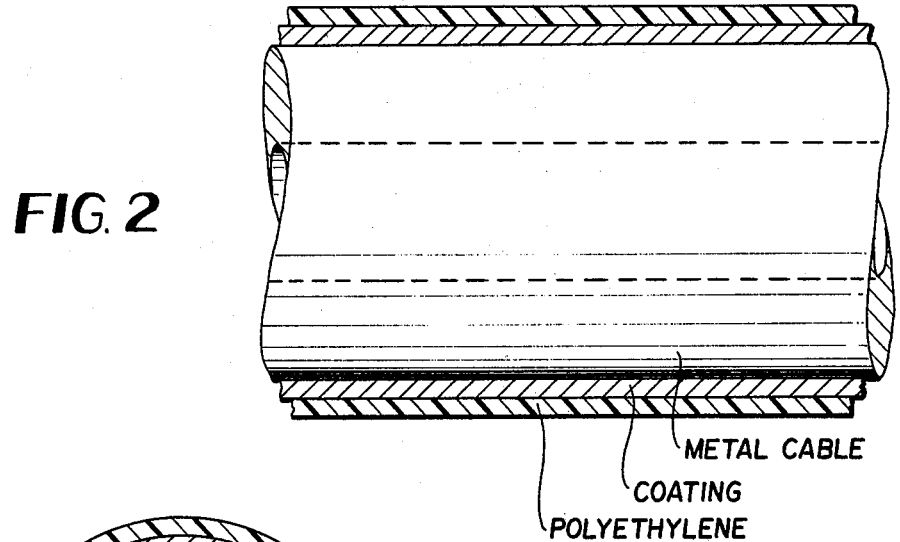
FIG. 2 is a side plan view of the metal cable and cut away view of the coating.
Figure 3:
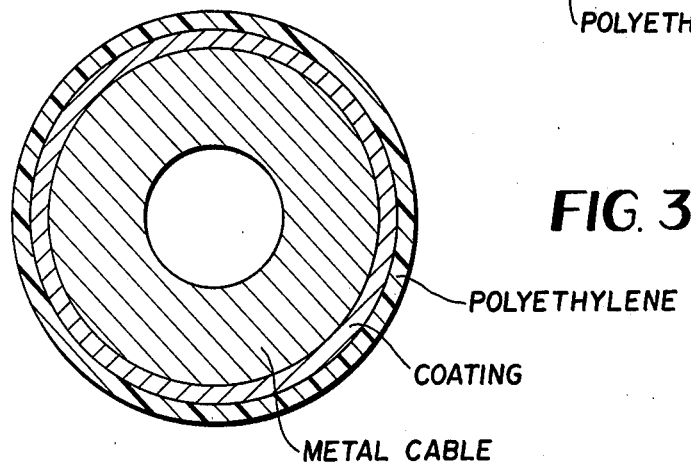
FIG. 3 is a cross-section view of the coated hollow metal cable.

Referring to FIGS. 1–3 it will be noted that the superconductive material is comprised as indicated by the legends of a metal cable circumscribed by a layer identified as a coating.

The coating is comprised of cobalt phthalocyanine and an alkali metal such as lithium, sodium or potassium.

The cable, which in the illustrated embodiment is hollow, is most preferably aluminum, but may be made of any other electrically normal conductive metal-although, the resultant superconductive article will not necessarily be equivalent to that employing tubular aluminum substrate for the alkali metal activated cobalt phthalocyanine coating.

The superconductive cable of this invention is readily fabricated utilizing ordinary hollow aluminum cable It is essential that the deposition of both cobalt phthalocyanine and alkali metal on the cable be effected in the absence of air and moisture. Accordingly, a non-oxidizing/inert atmosphere should be maintained during deposition. To this end, vacuum deposition is a particularly suitable means of forming the alkali metal activated cobalt phthalocyanine layer.

The vacuum deposition of materials is a well known procedure and indeed very sophisticated methods vacuum depositing superconductive films having been developed, as for instance the procedure disclosed in U.S. Pat. No. 3,615,881.

The alkali metal activated cobalt phthalocyanine layer of this invention may be prepared by simply first vacuum depositing cobalt phthalocyanine on the aluminum cable under conditions excluding air and moisture, followed by the vacuum deposition of alkali metal in the same manner or vacuum depositing cobalt phthalocyanine in a sodium gas atmosphere in order to form the 8Na-cobalt phthalocyanine complex according to Z Chem 6, page 8 1966. The amount of alkali metal deposition is adjusted to provide about 8 atoms of alkali metal per molecule of cobalt phthalocyanine. In addition, the aluminum cable has to be covered after impregnation under the same conditions namely, exclusion of air and moisture with a film or sheath of a material which is impermeable to air and water vapors and has a high dielectric constant. One of the most popular materials for this purpose is polyethylene. The art and technology of covering electric cables with polyethylene and equivalent protective coatings is well known Where the cable is not exposed to an oxidizing atmosphere that is, where use of same in an inert environment is contemplated the coating may be omitted.

The cable formed as described in the preceding paragraphs when incorporated in the proper cyrogenic environment, utilizing liquid nitrogen, hydrogen or natural gas or cold gases of corresponding temperatures operates as a superconductor.

To those skilled in the art it will be obvious upon a study of this disclosure that our invention permits of various modifications and may be given embodiments other than particularly illustrated herein, without departing from the essential features of the invention and within the scope of the claims annexed hereto.

I claim:

1. A superconductive article comprising an electrically normal conductive metal cable having cobalt phthalocyanine and an alkali metal layer thereupon, the ratio of alkali metal atoms to cobalt phthalocyanine molecules in said layer being about 8:1.

2. The superconductive article of claim 1 further characterized in that the electrically normal conductive metal is aluminum.

3. The superconductive article of claim 1 further characterized in that the cable is hollow and the layer is located on the outer surface of said hollow cable.

4. The superconductive article of claim 3 further characterized in that the hollow cable is comprised of aluminum.

5. The superconductive article of claim 4 further characterized in that the cobalt phthalocyanine and alkali metal layer is covered by a coat of material of high dielectric constant which is impermeable to air and water.

6. The superconductive article of claim 5 further characterized in that the superconductive article is coated with a polymeric coating.

7. The superconductive article of claim 6 where the polymeric coating comprises polyethylene.

8. The superconductive article of claim 1 further characterized in that the alkali metal is selected from the group consisting of sodium potassium and lithium.

9. The superconductive article of claim 8 further characterized in that the alkali metal is sodium.

* * * * *